United States Patent
Lu et al.

(10) Patent No.: US 7,292,485 B1
(45) Date of Patent: Nov. 6, 2007

(54) SRAM HAVING VARIABLE POWER SUPPLY AND METHOD THEREFOR

(75) Inventors: Olga R. Lu, Austin, TX (US);
Lawrence F. Childs, Austin, TX (US);
Craig D. Gunderson, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/461,200

(22) Filed: Jul. 31, 2006

(51) Int. Cl.
*G11C 5/14* (2006.01)
(52) U.S. Cl. .................. 365/189.09; 365/154; 365/227
(58) Field of Classification Search .................. 365/72
See application file for complete search history.

(56) References Cited

U.S. PATENT DOCUMENTS

| | | | |
|---|---|---|---|
| 4,094,008 A | * | 6/1978 | Lockwood et al. ......... 365/149 |
| 5,325,337 A | * | 6/1994 | Buttar ........................ 365/210 |
| 5,894,433 A | * | 4/1999 | Itoh et al. ................... 365/154 |
| 6,950,354 B1 | * | 9/2005 | Akiyoshi .................... 365/200 |
| 2005/0128790 A1 | | 6/2005 | Houston |
| 2005/0213415 A1 | | 9/2005 | Matsuzawa et al. |
| 2006/0034143 A1 | | 2/2006 | Yamaoka et al. |
| 2006/0262628 A1 | * | 11/2006 | Nii et al. .................... 365/226 |

* cited by examiner

*Primary Examiner*—Tan T. Nguyen
(74) *Attorney, Agent, or Firm*—Daniel D. Hill; James L. Clingan, Jr.

(57) ABSTRACT

A memory circuit has a memory array with a first line of memory cells, a second line of memory cells, a first power supply terminal, a first capacitance structure, a first power supply line coupled to the first line of memory cells; and a second power supply line coupled to the second line of memory cells. For the case where the second line of memory cells is selected for writing, a switching circuit couples the power supply terminal to the first power supply line, decouples the first power supply line from the second line of memory cells, and couples the second power supply line to the first capacitance structure. The result is a reduction in power supply voltage to the selected line of memory cells by charge sharing with the capacitance structure. This provides more margin in the write operation on a cell in the selected line of memory cells.

20 Claims, 3 Drawing Sheets

SRAM HAVING VARIABLE POWER SUPPLY AND METHOD THEREFOR

FIELD OF THE INVENTION

The present invention relates generally to memories, and more particularly, to a static random access (SRAM) memory having a variable power supply and method therefor.

BACKGROUND OF THE INVENTION

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft error, and power supply fluctuations which may cause the cell to inadvertently change logic states. Also, the SRAM cell must provide good stability during read operations without harming speed or the ability to write to the cell.

In a six transistor SRAM cell, an alpha ratio is defined as the width of a PMOS load transistor divided by the width of an NMOS access transistor. A beta ratio is defined as the width of an NMOS pull-down transistor divided by the width of the NMOS access transistor. The alpha and beta ratios are used to describe a SRAM cell's stability against the influences of factors such as power supply fluctuations and noise. Generally, increasing the alpha and beta ratios improves cell stability. However, improving stability comes at the expense of lower write performance. With technology scaling and the use of lower power supply voltages, it is becoming even more difficult to optimize a SRAM cell for both read and write margins at the same time.

Therefore, there is a need for a SRAM having improved cell stability while also having improved write margins.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Generally, the present invention provides, in one form, a SRAM memory array having good cell stability while also providing good write margins. In one embodiment, a lowered supply voltage is provided to selected columns of memory cells during a write operation. The lower supply voltage allows a logic state to be written to the memory cells more easily. When the memory array in not being written to, the supply voltage is raised to improve cell stability. In another embodiment, the supply voltage is reduced during the write operation by charge sharing with a dummy column of memory cells. The dummy column is implemented to be similar to a normal memory array column. The dummy column can be shared with any number of memory array columns. Charge sharing is decoded and is only applied on write cycles. Also, the amount of charge shared is programmable by selecting how many dummy cells are connected in the dummy column. In another embodiment, the charge sharing is implemented using a dummy row.

Figure 1:
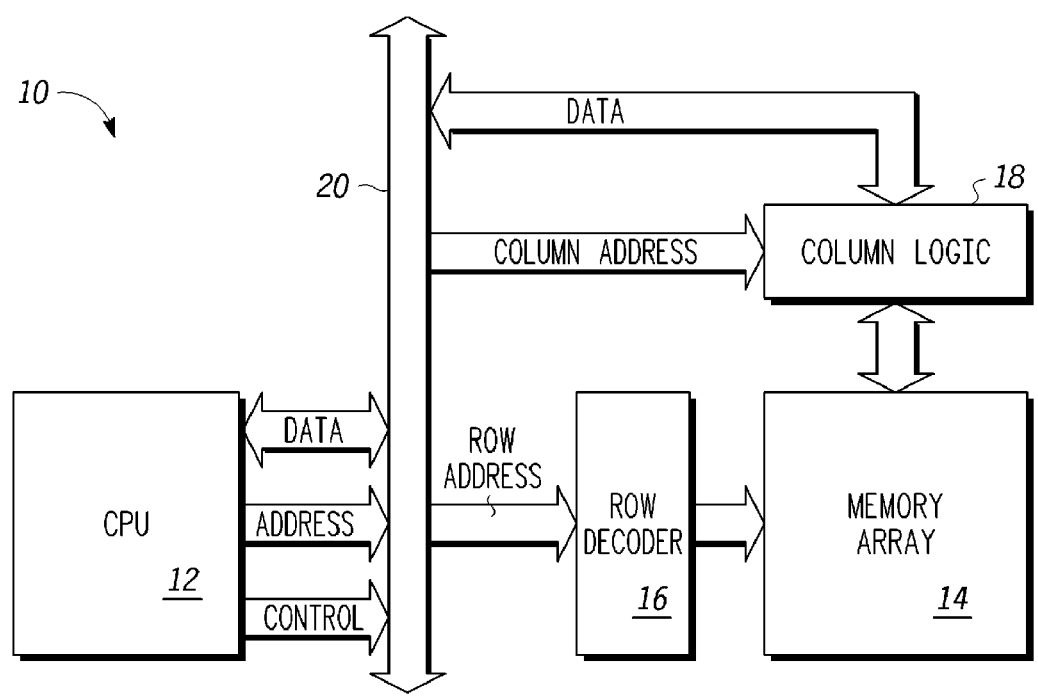
FIG. 1 illustrates, in block diagram form, a data processing system in accordance with one embodiment of the present invention.

FIG. 1 illustrates, in block diagram form, a data processing system 10 in accordance with one embodiment of the present invention. In one embodiment, data processing system 10 is implemented on an integrated circuit using a silicon-on-insulator (SOI) manufacturing technology. In other embodiments, the data processing system 10 may be implemented in another technology, such as for example, bulk silicon or gallium arsenide. Data processing system 10 includes a central processing system (CPU) 12, a memory array 14, a row decoder 16, a column logic block 18, and a bus 20. CPU 12 may be a processor capable of executing instructions, such as a microprocessor, digital signal processor, etc., or may be any other type of bus master, such as for example, a direct memory access (DMA) controller, debug circuitry, or the like. Also, the processor 12 may be a slave device, such as for example, any type of peripheral circuit which resides on the bus or slave device that requires access to a memory.

CPU 12 is bi-directionally coupled to bus 20. Bus 20 has a plurality of conductors for communicating address, data, and control information between CPU 12 and other circuits coupled to bus 20, such as memory array 14. The row decoder 16 has a plurality of input terminals for receiving a row address from the bus 20 for selecting a row of memory cells in memory array 14. Column logic 18 is bi-directionally coupled to memory array 14 for providing and receiving data in response to column select signals and control information. The column logic receives a column address, and in response, couples one or more columns of memory cells to the bus 20. Column logic 18 includes column decoders, sense amplifiers, and precharge and equalization circuits. A compiler (not shown) may be used to determine the memory configuration, such as for example, the number of columns accessed during a read or write operation, or the total number of rows and columns in a memory array. The sense amplifiers of column logic 18 are for sensing and amplifying the relatively low voltage signals from the selected memory cells. In other embodiments, column logic 18 may include additional or different circuits for inputting and outputting data from the memory.

During a read operation, data signals labeled "DATA" are read from selected memory cells of memory array 14 and provided to bus 20. During a write operation the data signals DATA are provided to selected memory cells from the bus 20. Note that in other embodiments, a bus interface block may be coupled between the bus 20 and the memory.

For purposes of describing the invention, the data processing system 10 of FIG. 1 is simplified to illustrate only a central processing unit and a memory coupled together via a bus. However, in other embodiments, the data processing system may be much more complex, including for example, multiple processors coupled to multiple buses, additional memories, and other circuits not shown in FIG. 1.

Figure 2:
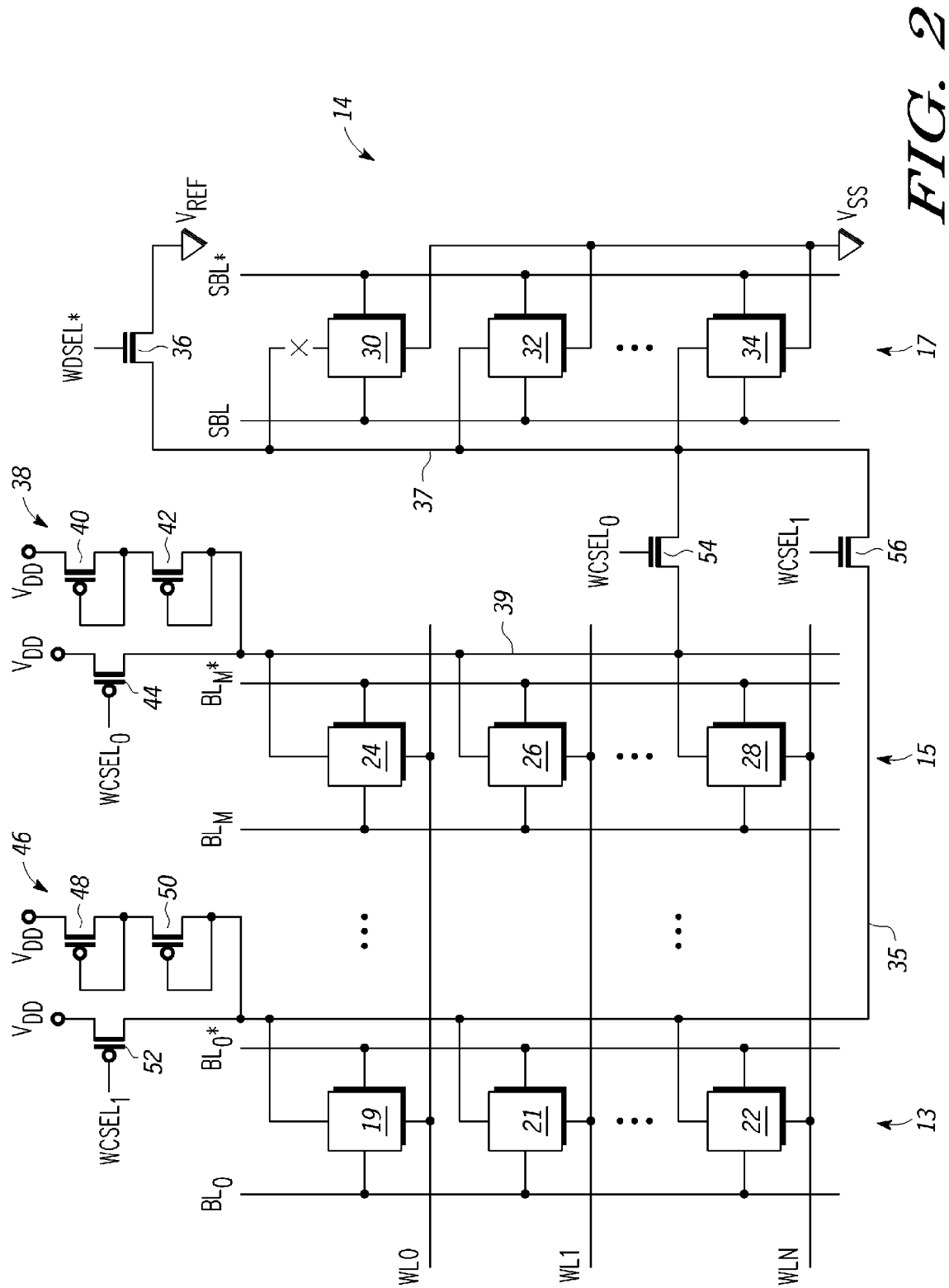
FIG. 2 illustrates, in schematic diagram form, one embodiment of the memory array of FIG. 1.

FIG. 2 illustrates the memory array 14 of FIG. 1 in more detail. In the memory array 14, the memory cells are organized in rows and columns. A column of memory cells includes a bit line pair and all of the memory cells coupled to the bit line pair. For example, the bit line pair labeled "$BL_0$" and "$BL*_0$" and cells 19, 21, and 22 comprise a column 13. A column 15 includes a bit line pair $BL_M$ and $BL*_M$ and memory cells 24, 26, and 28. The bit line pairs are used to communicate differential signals to and from the cells during read and write operations. A row of memory array 14 comprises a word line and all of the memory cells coupled to the word line. For example, a word line labeled "$WL_0$" and memory cells 19 and 24 comprise one row. Likewise, word line $WL_1$ and memory cells 21 and 26 comprise another row. Word line $WL_N$ and memory cells 22 and 28 comprise another row. Note that the "*" (asterisk) at the end of the signal name indicates that the signal having the "*" is a logical complement of a signal having the same name but lacking the "*".

The memory cells of memory array 14 are conventional 6 transistor SRAM cells. In other embodiments, the type of SRAM cell can be different. In the embodiment of FIG. 2, each of the memory cells includes a latch circuit comprising a pair of cross coupled inverters to form two storage nodes. An access transistor couples each storage node to a bit line. The pair of cross coupled inverters is coupled between two power supply terminals. In the illustrated embodiment, one power supply terminal of the cells of column 13 is coupled to a conductor 35, and one power supply terminal of the cells of column 15 is coupled to a conductor 39. Conductors 35 and 39 are used to supply a power supply voltage to the cells. All of the cells are coupled to ground (not shown). Generally, a predetermined number of columns has a corresponding power supply conductor like conductor 35 and 39. A power supply voltage is selectively provided to the conductors 35 and 39. P-channel transistor 52 has a source coupled to a power supply voltage terminal labeled "$V_{DD}$", a gate for receiving a control signal labeled "$WCSEL_1$", and a drain coupled to conductor 35. Clamping circuit 46 includes diode-connected P-channel transistors 48 and 50 coupled in series between $V_{DD}$ and conductor 35. Also, P-channel transistor 44 has a source coupled to $V_{DD}$, a gate for receiving control signal "$WCSEL_0$", and a drain coupled to conductor 39. Clamping circuit 38 includes diode-connected P-channel transistors 40 and 42 coupled in series between $V_{DD}$ and conductor 39. In other embodiments, the clamping circuit can be different. For example, in another embodiment, one or more diode connected N-channel transistors can be used, or a reference voltage can be used.

Dummy column 17 is similar to a normal memory column and includes a pair of dummy bit lines labeled "SBL" and "SBL*. Dummy SRAM cells 30, 32 and 34 are coupled to the dummy bit lines SBL and SBL* and are conventional SRAM cells in the illustrated embodiment. Each of the dummy cells has a supply terminal that can be coupled to a conductor 37. The other supply terminal of the dummy cells is coupled to another power supply terminal labeled "$V_{SS}$". In the described embodiment, $V_{SS}$ is coupled to ground and $V_{DD}$ is coupled to receive a positive power supply voltage, for example one volt. In other embodiments, the power supply voltage may be different. Dummy column 17 is used for capacitance sharing with memory array 14 during a write operation. The amount of capacitance shared is determined in part by how many memory cells are coupled to conductor 37. The conductor 37 is coupled to receive a reference voltage labeled "$V_{REF}$" via an N-channel transistor 36. In one embodiment, the reference voltage is ground. In another embodiment, $V_{REF}$ may be another voltage. N-channel transistor 36 has a first source/drain terminal coupled to conductor 37, a second source/drain terminal coupled to $V_{REF}$, and a control gate coupled to receive control signal WDSEL*.

Dummy column 17 is coupled to each of the normal columns of memory array 14. In FIG. 2, transistor 54 is used to couple conductor 37 to conductor 39 of column 15 in response to a control signal labeled "$WCSEL_0$", and transistor 56 is used to couple conductor 37 to conductor 35 in response to control signal labeled "$WCSEL_1$". In other embodiments, transistors 54 and 56 can be different. For example P-channel transistors can be used, or a combination of P-channel and N-channel transistors can be used.

In operation, prior to writing to the SRAM cells of memory array 14 and during a read operation, control signals $WCSEL_1$ and $WCSEL_0$ are logic low voltages causing the cells of the array to receive the supply voltage $V_{DD}$ via transistors 52 and 44. Also prior to a write operation, control signal WDSEL* is provided as a logic high voltage to cause transistor 36 to be conductive. Reference voltage $V_{REF}$ is provided to the supply terminals of each of the memory cells 30, 32, and 34 precharging the cells of dummy column 17 to $V_{REF}$ (ground). During a write operation, one or both of decoded control signals $WCSEL_0$ and $WCSEL_1$ are asserted as logic high signals to cause transistors 52 and 44 to be substantially non-conductive and to cause transistors 54 and 56 to be conductive to cause the supply terminals of the cells of columns 13 and 15 to be coupled to conductor 37. Charge sharing occurs between the selected columns of the memory array 14 and the dummy column 17 to reduce the supply voltage of the memory cells of memory array 14 by a predetermined amount depending on the relative capacitances of dummy column 17 and the selected columns of memory array 14. The capacitance of dummy column 17 can be adjusted by selecting the number of memory cells coupled to conductor 37. As illustrated in FIG. 2 with an "X", capacitance of dummy column 17 is reduced by not coupling the supply terminals of a predetermined number of cells during the manufacturing process, such as for example, cell 30. The clamping circuits 38 and 46 function to limit the voltage drop on conductors 35 and 39 to a predetermined minimum voltage. The supply voltage is only reduced on the columns being written to. The reduced supply voltage functions to improve the write margin of the selected cells, while maintaining the cell stability of the unselected cells.

During a read operation, and during the time when the memory cells are not being accessed, the control signals $WCSEL_0$ and $WCSEL_1$ are asserted as a logic low to cause transistors 52 and 44 to be conductive, thus causing $V_{DD}$ to be provided to all of the cells. The logic low control signals $WCSEL_0$ and $WCSEL_1$ also causes transistors 54 and 56 to be non-conductive. Providing a higher supply voltage to the memory cells during a read operation of the memory functions to improve the read margin. Also, a relative capacitance between the dummy column and the memory array columns remains substantially constant for any number of rows.

Figure 3:
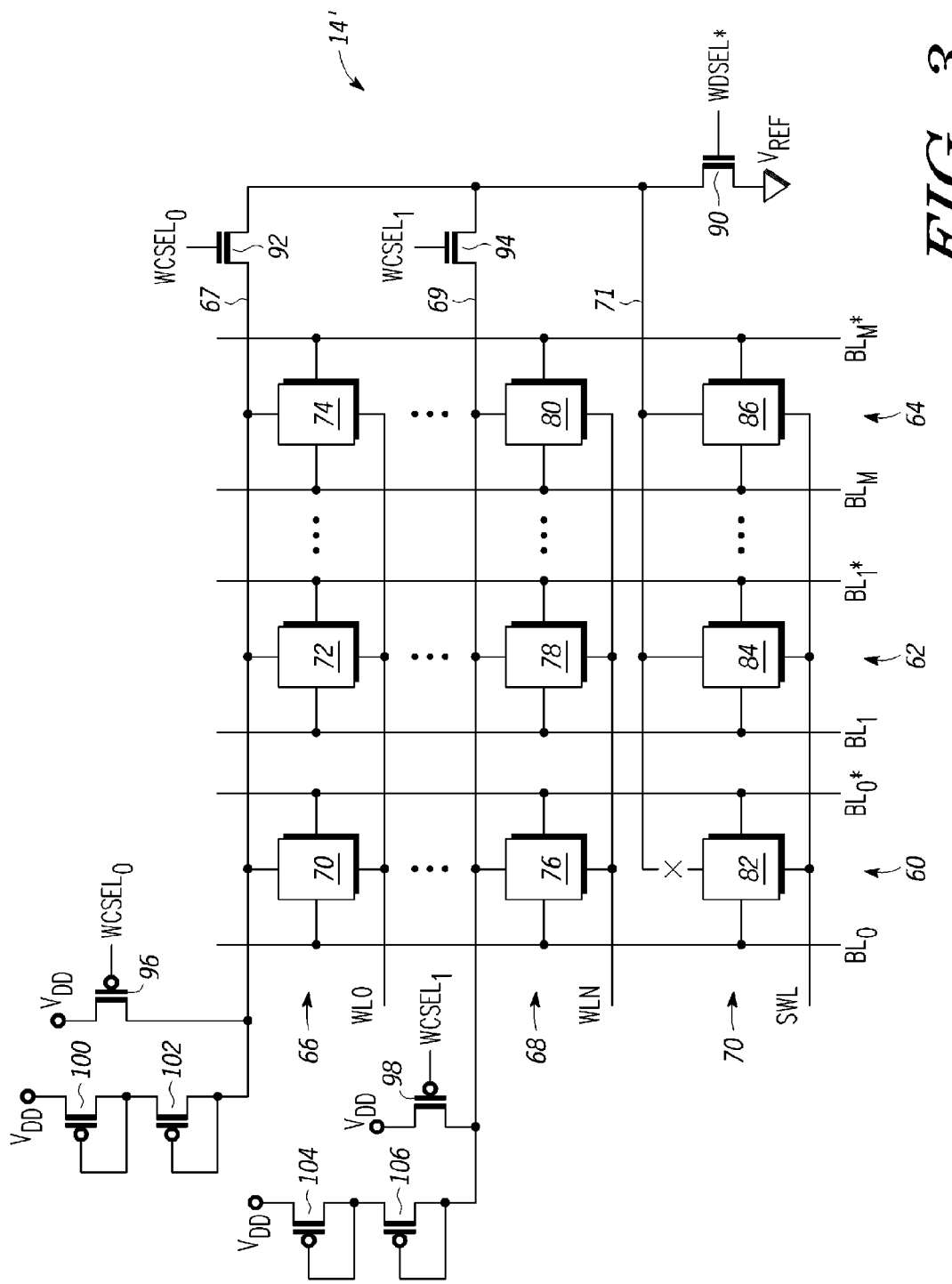
FIG. 3 illustrates, in schematic diagram form, another embodiment of the memory array of FIG. 1.

FIG. 3 illustrates, in schematic diagram form, a memory array 14' for use in the data processing system of FIG. 1. In FIG. 3, a dummy row 70 is provided to allow charge sharing between the dummy row 70 and selected rows of memory array 14'.

In memory array 14' the bit line pair labeled "$BL_0$" and "$BL*_0$" and cells 70, 76, and 82 comprise a column 60. A column 62 includes a bit line pair $BL_1$ and $BL*_1$ and memory cells 72, 78, and 84. A column 64 includes bit line pair $BL_M$ and $BL*_M$ and memory cells 74, 80, and 86. A row of memory array 14' comprises a word line and all of the memory cells coupled to the word line. For example, a word line labeled "$WL_0$" and memory cells 70, 72, and 74 comprise one row. Likewise, word line WLN and memory cells 76, 78, and 84 comprise another row.

The memory cells of memory array 14' are conventional 6 transistor SRAM cells as discussed above regarding FIG. 2. In other embodiments, the type of SRAM cell can be different. Each of the cells is coupled to a power supply conductor. The cells of row 66 are coupled to a conductor 67. The power supply terminals of the cells of row 68 are coupled to a conductor 69. Conductors 67 and 69 are used to supply a power supply voltage to the cells. All of the cells have another power supply terminal coupled to ground (not shown). P-channel transistor 96 has a source coupled to a power supply voltage terminal labeled "$V_{DD}$", a gate for receiving a control signal labeled "$WCSEL_0$", and a drain coupled to conductor 67. A clamping circuit is made up of diode-connected P-channel transistors 100 and 102 coupled in series between $V_{DD}$ and conductor 67. Also, P-channel transistor 98 has a source coupled to $V_{DD}$, a gate for receiving control signal "$WCSEL_1$", and a drain coupled to conductor 69. A clamping circuit includes diode-connected P-channel transistors 104 and 106 coupled in series between $V_{DD}$ and conductor 69. In other embodiments, the clamping circuit can be different. For example, in another embodiment, diode connected N-channel transistors can be used, or a reference voltage can be used.

Dummy row 70 is similar to a normal memory row and includes a word line labeled "SWL" and all of the cells coupled to SWL. Dummy SRAM cells 82, 84, and 86 are coupled to the dummy word line SWL and are conventional SRAM cells in the illustrated embodiment. Each of the dummy cells has a supply terminal that can be coupled to a conductor 71. Generally, a predetermined number of rows of memory array 14' has a corresponding power supply conductor like dummy row conductor 71. The other supply terminal of the dummy cells is coupled to another power supply terminal (not shown). In the described embodiment, one power supply voltage terminal is coupled to ground and the other power supply terminal is coupled to receive a positive power supply voltage, for example one volt. In other embodiments, the power supply voltage may be different. Dummy row 70 is used for capacitance sharing with memory array 14' during a write operation. The amount of capacitance shared is determined in part by how many memory cells are coupled to conductor 71. The conductor 71 is coupled to receive a reference voltage labeled "$V_{REF}$" via an N-channel transistor 90. In one embodiment, the reference voltage at $V_{REF}$ is ground. In another embodiment, $V_{REF}$ may receive any voltage. N-channel transistor 90 has a first source/drain terminal coupled to conductor 71, a second source/drain terminal coupled to $V_{REF}$, and a control gate coupled to receive control signal WDSEL*.

Dummy row 70 is coupled to each of the normal rows of memory array 14'. In FIG. 3, transistor 92 is used to couple conductor 67 to conductor 71 in response to a control signal labeled "WCSEL0", and transistor 94 is used to couple conductor 69 to conductor 71 in response to a control signal labeled "WCSEL1". In other embodiments, transistors 92 and 94 can be different. For example P-channel transistors can be used, or a combination of P-channel and N-channel transistors can be used.

In operation, prior to writing to the SRAM cells of memory array 14' and during a read operation, control signals $WCSEL_1$ and $WCSEL_0$ are logic low voltages causing the cells of the array to receive the supply voltage $V_{DD}$ via transistors 96 and 98. Also prior to a write operation, control signal WDSEL* is provided as a logic high voltage to cause transistor 90 to be conductive. $V_{REF}$ is provided to the supply terminals of each of the memory cells, such as cells 82, 84, and 86, precharging the cells of dummy row 70 to $V_{REF}$, or ground in the illustrated embodiment. During a write operation, one or both of decoded control signals $WCSEL_0$ and $WCSEL_1$ are asserted as logic highs to cause transistors 96 and 98 to be substantially non-conductive and transistors 92 and 94 to be conductive to cause the supply terminals of the cells of rows 66 and 68 to be coupled to conductor 71. Charge sharing occurs between the selected rows of the memory array 14' and the dummy row 70 to reduce the supply voltage of the memory cells of memory array 14' by a predetermined amount depending on the relative capacitances of dummy row 70 and the selected rows of memory array 14'. As illustrated in FIG. 3 with an "X", capacitance of dummy row 70 can be reduced by not coupling the supply terminals of a predetermined number of cells during the manufacturing process, such as for example, cell 82. The clamping circuits function to limit the voltage drop on conductors 67 and 69 to a predetermined minimum voltage. The reduced supply voltage functions to improve the write margin of the selected cells, while maintaining the cell stability of the unselected cells.

During a read operation, the control signals $WCSEL_0$ and $WCSEL_1$ are asserted as a logic low to cause transistors 96 and 98 to be conductive to the cause $V_{DD}$ to be provided to all of the cells. The logic low control signals $WCSEL_0$ and $WCSEL_1$ also causes transistors 92 and 94 to be non-conductive. Providing a higher supply voltage to the memory cells during a read operation, and when the memory is not being accessed, functions to improve the read and static margins. Also, a relative capacitance between the dummy row and the memory array rows remains substantially constant for any number of rows.

Generally, in one embodiment, a memory circuit comprises a memory array having a first line of memory cells, a second line of memory cells, a first power supply terminal, and a first capacitance structure. A first power supply line is coupled to the first line of memory cells. A second power supply line is coupled to the second line of memory cells. A switching circuit that has transistors that, when the second line of memory cells is selected for writing, couple the first power supply terminal to the first power supply line, decouple the first power terminal from the second line of memory cells, and couple the second power supply line to the first capacitance structure.

In another embodiment, a method comprises: providing a memory comprising: a memory array comprising a first line of memory cells and a second line of memory cells; a first power supply terminal; a first capacitance structure; a first power supply line coupled to the first line of memory cells; and a second power supply line coupled to the second line of memory cells; selecting the second line of memory cells for writing; coupling the first power supply terminal to the first power supply line; decoupling the second line of memory cells from the first power supply terminal; coupling charge from the second power supply line to the first capacitance structure; and writing a memory cell in the second line of memory cells.

In another embodiment, a memory circuit comprises a memory array having a first line of memory cells and a second line of memory cells, a power supply terminal, and a capacitance structure. A first power supply line is coupled to the first line of memory cells. A second power supply line is coupled to the second line of memory cells. Precharging means is coupled to the capacitance structure for precharging the capacitance structure to a predetermined voltage prior to a write operation for the second line of memory cells. The memory also includes first coupling means, decoupling means, and second coupling means. The first coupling means for coupling the power supply terminal to the first power supply line during the write operation for the second line of memory cells. The decoupling means for decoupling the first power supply line from the second line of memory cells during the write operation for the second line of memory cells. The second coupling means for coupling the second supply line to the first capacitance structure during the write operation for the second line of memory cells.

Various changes and modifications to the embodiments herein chosen for purposes of illustration will readily occur to those skilled in the art. For example, variations in the types of conductivities of transistors, the types of transistors, etc. may be readily made. One skilled in the art will recognize that even though the embodiments of the present invention are directed to using P-channel pull-up devices, and N-channel pull-down devices, the conductivity types of the transistors can be changed, the circuit schematic reversed, and power supply voltages changed to provide substantially the same benefits and advantages. Also, in another embodiment, a dummy column may be coupled to provide a programmable supply voltage to bias the bit lines using the same or similar circuitry as described above. To the extent that such modifications and variations do not depart from the spirit of the invention, they are intended to be included within the scope thereof which is assessed only by a fair interpretation of the following claims.

What is claimed is:

1. A memory circuit, comprising:
    a memory array comprising a first line of memory cells and a second line of memory cells;
    a first power supply terminal;
    a first capacitance structure includes a plurality of dummy cells;
    a first power supply line coupled to the first line of memory cells;
    a second power supply line coupled to the second line of memory cells; and
    a switching circuit that has transistors that, connected between the first power supply terminal, the first power supply line, the second power supply line and the first capacitance structure wherein when the second line of memory cells is selected for writing, couple the first power supply terminal to the first power supply line, decouple the first power supply terminal from the second line of memory cells, and couple the second power supply line to the first capacitance structure.

2. The memory circuit of claim 1, wherein the first line of memory cells comprises a first column of memory cells and the second line of memory cells comprises a second line of memory cells.

3. The memory circuit of claim 1, wherein the first capacitance structure comprises:
    a dummy line; and
    the plurality of dummy cells coupled to the dummy line.

4. The memory circuit of claim 3, further comprising a first dummy cell adjacent to but not coupled to the dummy line.

5. The memory circuit of claim 1, wherein the first power supply terminal comprises a positive power supply terminal.

6. The memory circuit of claim 1, wherein the switching circuit further comprises a switching transistor coupled between the capacitance structure and a voltage reference terminal.

7. The memory circuit of claim 6, wherein the voltage reference terminal comprises a ground terminal.

8. The memory circuit of claim 1, wherein the first line of memory cells comprises a first row of memory cells and the second line of memory cells comprises a second row of memory cells.

9. The memory of claim 1, further comprising:
    a second power supply terminal;
    a third line of memory cells intersecting the first and second line of memory cells;
    a fourth line of memory cells intersecting the first and second line of memory cells;
    a second capacitance structure;
    a third power supply line coupled to the third line of memory cells; and
    a fourth power supply line coupled to the fourth line of memory cells; wherein
    the switching circuit further comprising transistors that, when the fourth line of memory cells is selected for writing, couple the second power supply terminal to the third power supply line, decouple the second power supply terminal from the fourth line of memory cells, and couple the fourth power supply line to the second capacitance structure.

10. The memory circuit of claim 9, wherein:
    the first and second lines of memory cells comprise columns;
    the third and fourth lines of memory cells comprise rows;
    the first power supply terminal comprises a positive power supply terminal;
    the second power supply terminal comprises a negative power supply terminal;
    the first capacitance structure comprises a first line and a first plurality of dummy cells coupled to the first line; and
    the second capacitance structure comprises a second line and a second plurality of dummy cells coupled to the second line.

11. The memory circuit of claim 1, further comprising a voltage clamp coupled between the first power supply terminal and the first power supply line.

12. A method, comprising:
    providing a memory comprising:
        a memory array comprising a first line of memory cells and a second line of memory cells;
        a first power supply terminal;
        a first capacitance structure includes a plurality of dummy cells;
        a first power supply line coupled to the first line of memory cells; and
        a second power supply line coupled to the second line of memory cells;

a switching circuit that has transistors that connected between the first power supply terminal, the first power supply line, the second power supply line and the first capacitance structure selecting the second line of memory cells for writing;

coupling the first power supply terminal to the first power supply line;

decoupling the second line of memory cells from the first power supply terminal;

coupling charge from the second power supply line to the first capacitance structure; and writing a memory cell in the second line of memory cells.

13. The method of claim 12 further comprising precharging the first capacitance structure prior to the step of coupling charge.

14. The method of claim 13, wherein the step of precharging is further characterized as precharging the first capacitance structure to ground.

15. The method of claim 13, wherein the step of precharging is further characterized by precharging the first capacitance structure to a voltage present on the first power supply terminal.

16. The memory circuit of claim 12, further comprising preventing the step of coupling charge from reducing a voltage on the second power supply line to a level below a predetermined voltage.

17. A memory circuit, comprising:

a memory array comprising a first line of memory cells and a second line of memory cells;

a power supply terminal;

a capacitance structure;

a first power supply line coupled to the first line of memory cells;

a second power supply line coupled to the second line of memory cells;

precharging means for precharging the capacitance structure to a predetermined voltage prior to a write operation for the second line of memory cells;

first coupling means for coupling the power supply terminal to the first power supply line during the write operation for the second line of memory cells;

decoupling means for decoupling the first power supply line from the second line of memory cells during the write operation for the second line of memory cells; and second coupling means for coupling the second supply line to the first capacitance structure during the write operation for the second line of memory cells.

18. The memory circuit of claim 17 wherein the predetermined voltage comprises one of a group consisting of a positive power supply voltage and ground.

19. The memory circuit of claim 18, wherein the capacitance structure comprises:

a dummy line;

a plurality of dummy cells adjacent to and coupled to the dummy line; and a first dummy cell adjacent to but not coupled to the dummy line.

20. The memory circuit of claim 17, wherein the first line of memory cells comprises one of a group consisting of a row and a column.

* * * * *